United States Patent
Chen et al.

(10) Patent No.: US 7,924,610 B2
(45) Date of Patent: Apr. 12, 2011

(54) METHOD FOR CONDUCTING OVER-ERASE CORRECTION

(75) Inventors: Chung Zen Chen, Hsinchu (TW); Chung Shan Kuo, Taipei County (TW); Tzeng Ju Hsue, Taoyuan County (TW); Ching Tsann Leu, Hsinchu County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 296 days.

(21) Appl. No.: 12/350,635

(22) Filed: Jan. 8, 2009

(65) Prior Publication Data

US 2010/0172188 A1 Jul. 8, 2010

(51) Int. Cl.
*G11C 11/34* (2006.01)

(52) U.S. Cl. ......... 365/185.03; 365/185.29; 365/185.22; 365/218

(58) Field of Classification Search ............. 365/185.3, 365/185.29, 185.22
See application file for complete search history.

(56) References Cited

U.S. PATENT DOCUMENTS

| 5,400,286 | A | 3/1995 | Chu et al. |
| 6,504,765 | B1 * | 1/2003 | Joo ................. 365/185.29 |
| 6,639,844 | B1 * | 10/2003 | Liu et al. ............. 365/185.3 |
| 7,123,518 | B2 * | 10/2006 | Cheng et al. ......... 365/185.28 |
| 2005/0073886 | A1 | 4/2005 | Hamilton et al. |

* cited by examiner

*Primary Examiner* — Pho M Luu
*Assistant Examiner* — Tha-O Bui
(74) *Attorney, Agent, or Firm* — WPAT, P.C.; Anthony King

(57) ABSTRACT

A method for conducting an over-erase correction describes the steps of: conducting a first erase and verification operation; using an FN soft program to correct over-erased cells if bit line leakage is found after the first erase and verification operation; conducting a second erase and verification operation; and using a hot carrier HC soft program to correct over-erased cells if bit line leakage is found after the second erase and verification operation.

6 Claims, 8 Drawing Sheets

METHOD FOR CONDUCTING OVER-ERASE CORRECTION

BACKGROUND OF THE INVENTION

1. Field of the Invention

The present invention relates to a method for conducting an over-erased correction, and more particularly, to a method using Fowler-Nordheim (FN) tunneling and hot carrier soft program to narrow the threshold distribution of the over-erased cells.

2. Description of the Related Art

When a flash memory is erased, it is possible that its threshold voltage becomes too low. Over-erase means a bit line leakage of a memory cell exists in the flash memory. If such memory cell is erased again, it may cause a deep over-erase, which is unrecoverable. Normally, over-erased cells induce bit line leakage during read operation, resulting a loss of "0" reading margin. On the other hand, over-erased cells cause under-erased cells, resulting in a loss of reading '1' margin. FIG. 1 shows a hint diagram in which over-erased cells cause under-erased bits. During a programming operation, over-erased cells induce a large bit line leakage current, causing bit line voltage to drop and reducing the programming efficiency. Therefore, it is important during flash memory operations to prevent occurrence of over-erase events.

The traditional over-erase correction method that uses a drain avalanche hot carrier (DAHC) injection for memory cells is not efficient due to excessive long time and excessive power consumption at high temperature and low operating voltage. Another solution to correct over-erase is by using positive gate stress on the over-erased cells. However, some over-erased or erratic-erased cells show unstable and unpredictable behavior under positive gate stress. Consequently, they cause over-stress (over-programming) to the erased cells and exhibit operational margin loss during read or erase operations.

U.S. Pat. No. 5,400,286, entitled "Self-Recovering Erase Scheme to Enhance Flash Memory Endurance," employs only a word line stress for over-erase correction, as shown in FIG. 2. The word line stress is used to narrow the distribution of threshold voltages after an erase of an array of memory. However, this method must conduct a number of loops to stress word lines due to a complex convergence on some over-erased or erratic-erased bits, which consumes a lot of time.

US Patent Publication 2005/0073886, entitled "Memory Device and Method Using Positive Gate Stress to Recover Over-Erased Cell," provides three methods to solve the over-erased correction. In FIG. 3A, the step of applying positive gate stress is not in the loop of erase verification and thus over-erase situations still likely occur. Therefore, the flow chart suffers from an inefficient soft program operation. Moreover, "apply positive gate stress" at last may cause over-stress issue. The positive gate stress operation corresponding to FN tunneling includes applying a positive gate voltage of, for example, about 8 volts to about 12 volts to all of the wordlines (gate electrodes) simultaneously, while grounding all of the bitlines (sources and drains). The positive gate stress can be applied for a duration between about 1 ms and about 5 seconds. The soft programming of a normal bit is performed by applying a voltage potential (e.g., about 4 volts to about 8 volts), to the gate electrode and a voltage potential (e.g., about 3 volts to 5 volts), to the drain, while grounding or floating the source. In one embodiment, the soft programming is applied as a pulse having a duration between about 0.5 µs and 0.5 sec. In FIG. 3B, the sequence between the steps of applying positive gate stress and hot carrier (HC) soft program is switched. However, because the step of HC soft program is after the step of applying positive gate stress, the drain voltage drops due to over-erased cells induced bit line leakage and thus causes a loss of efficiency. In addition, the flow chart in FIG. 3B still has an unsafe erase-verification loop and may cause an over-stress and induce a loss of sensing margin during a read or erase verification. In FIG. 3C, the flow chart puts the steps of HC soft program and applying positive gate stress in the verification loop and thus the drawbacks of safety concerns in FIGS. 3A and 3B can be eliminated. However, doing so restores the drawback of the flow chart in FIG. 2 which conducts a large number of verification loops and thus wastes a lot of time.

FIG. 4 shows an experiment on the flow chart in FIG. 2. After an erase operation is conducted, the number of bit line leakages is found to be 4523. Then an FN soft program is applied for 40 ms to correct the undesirable over-erased cells. However, the positive gate stress causes the risk of over-programming. Therefore, it is necessary to conduct a second erase operation for 10 ms, and after that it is found that there are 140 bit line leakages in the memory cells. Therefore, a second FN soft program operation is conducted for 40 ms to correct the over-erased cells. In a similar manner, iteration between the erase and verification operations and the FN soft program is continuously conducted and not easy to converge.

SUMMARY OF THE INVENTION

The above-mentioned problems are addressed by the present invention. The method of the present invention will be understood according to the disclosure of the following specification and drawings.

The method for conducting an over-erase correction according to one embodiment of the present invention comprises the steps of: conducting a first erase and verification operation; using an FN soft program to correct over-erased cells if bit line leakage is found after the first erase and verification operation; conducting a second erase and verification operation; and using a hot carrier HC soft program to correct over-erased cells if bit line leakage is found after the second erase and verification operation.

The method for conducting an over-erase correction according to one embodiment of the present invention comprises the steps of: conducting one iteration of an FN soft program correct over-erased cells; and conducting one iteration of an HC soft program to correct over-erased cells. The FN soft program and HC soft program do not involve iteration with an erase verification, and the threshold distribution of the over-erased cells is narrowed.

BRIEF DESCRIPTION OF THE DRAWINGS

The invention will be described according to the appended drawings in which.

DETAILED DESCRIPTION OF THE INVENTION

Figure 5:
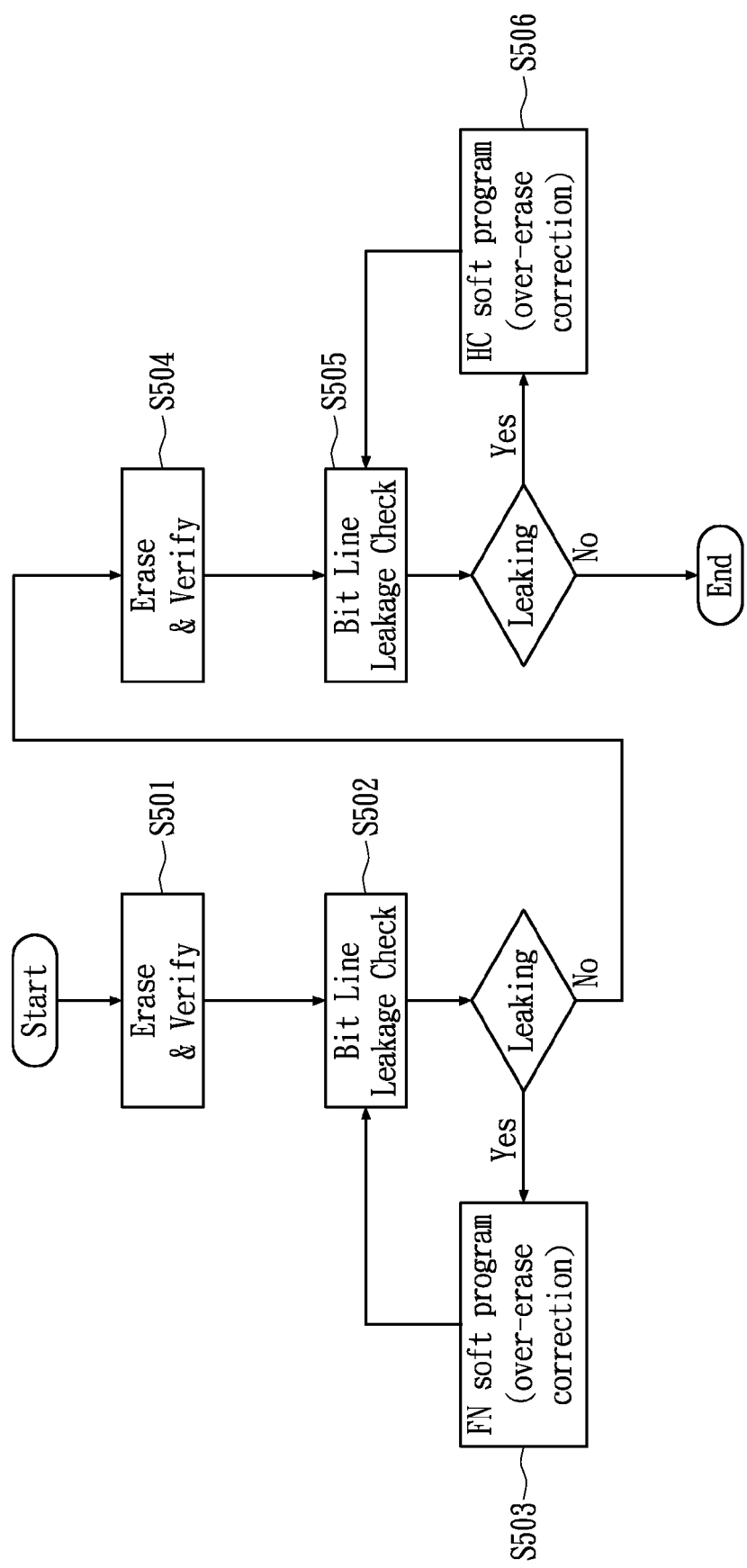
FIG. 5 shows a flow chart in accordance with one embodiment of the present invention.

FIG. 5 shows an exemplary flow chart of the present invention. In step S501, erase and verification operations are conducted, and if the verification is confirmed, the flow enters step S502. In step S502, the bit line leakage is checked, which indicates presence of any over-erased cells. If some bit line leakages occur, step S503 is performed, which conducts an FN soft program to correct the over-erased cells. Normally, the FN soft program method can be conducted by a reversed erase or a positive gate stress operation. The flow iterates between steps S502 and S503 until no leakages are found. Step S504 relates to the second erase and verification operation, and if the verification passes, the flow enters step S505. In step S505, the bit line leakage is checked, which represents presence of over-erased cells. If some bit line leakages occur, step S506 is performed, which conducts an HC soft program to correct the over-erased cells. Normally, the HC soft program method can be preformed by drain avalanche hot carrier injection or a channel hot carrier injection for that cell. The flow iterates between steps S505 and S506 until no further leakages are found.

Figure 1:
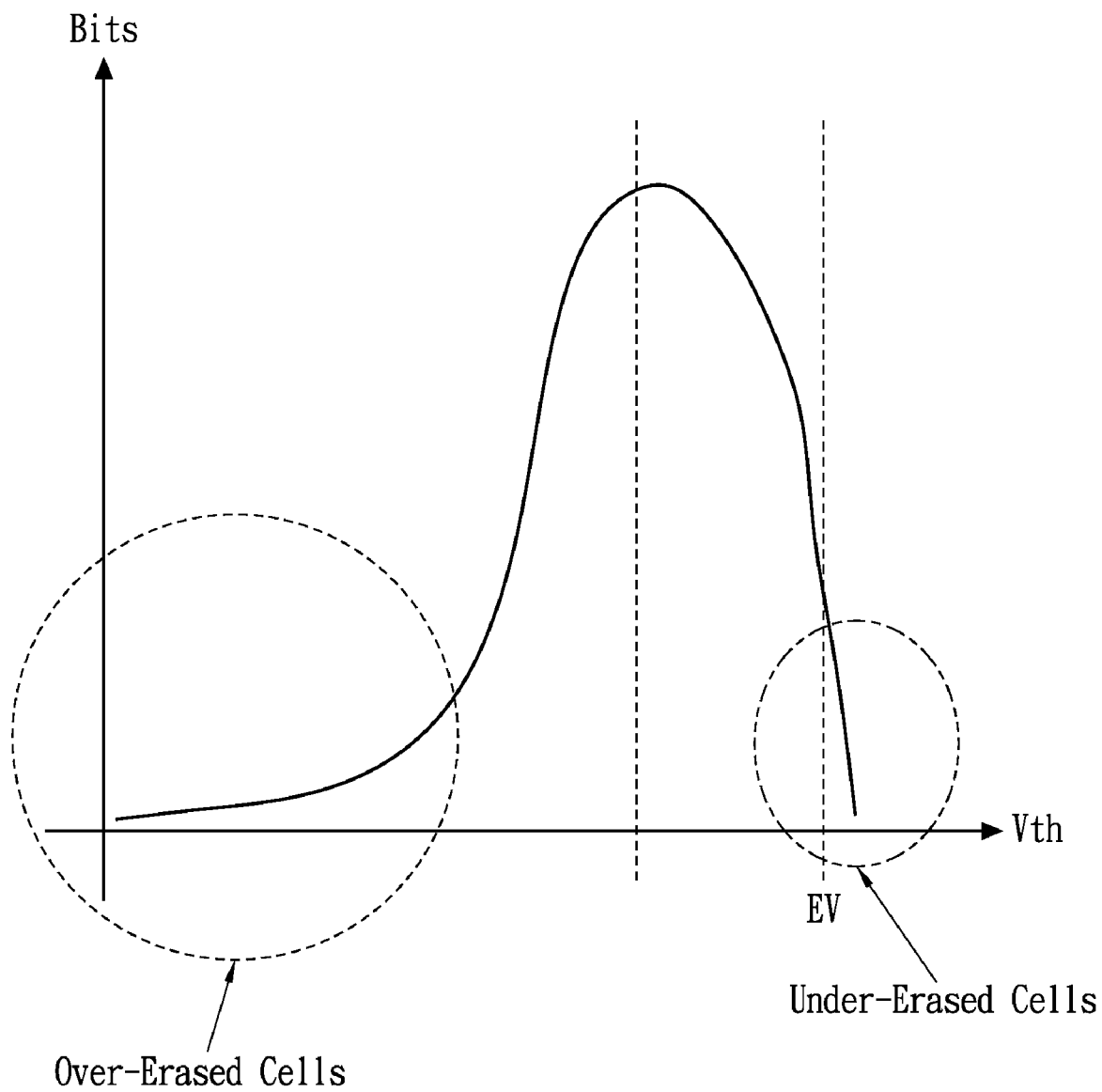
FIG. 1 shows a hint diagram in which over-erased cells cause under-erased bits.
Figure 2:
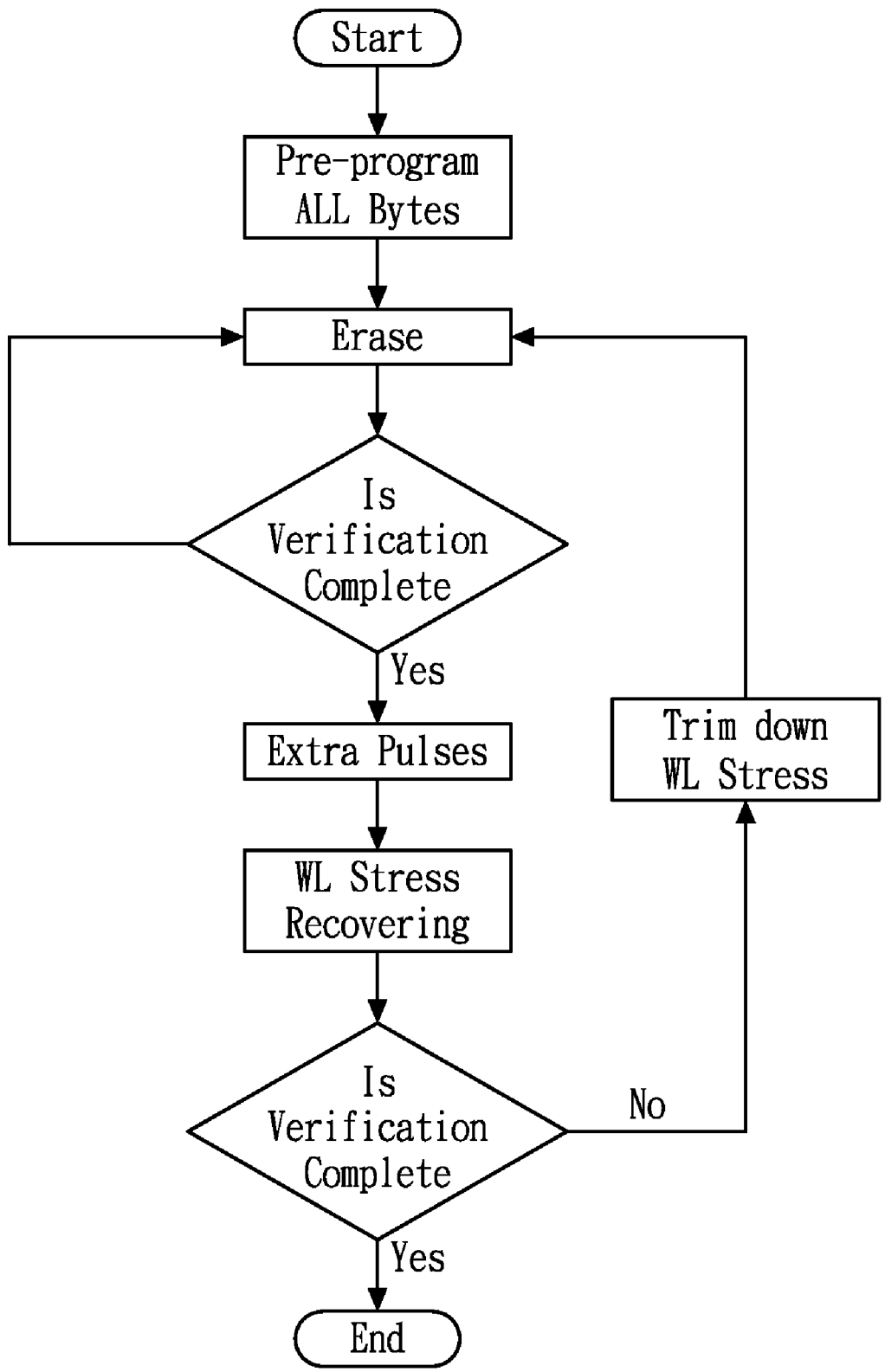
FIG. 2 shows a prior flow chart.
Figure 3C:
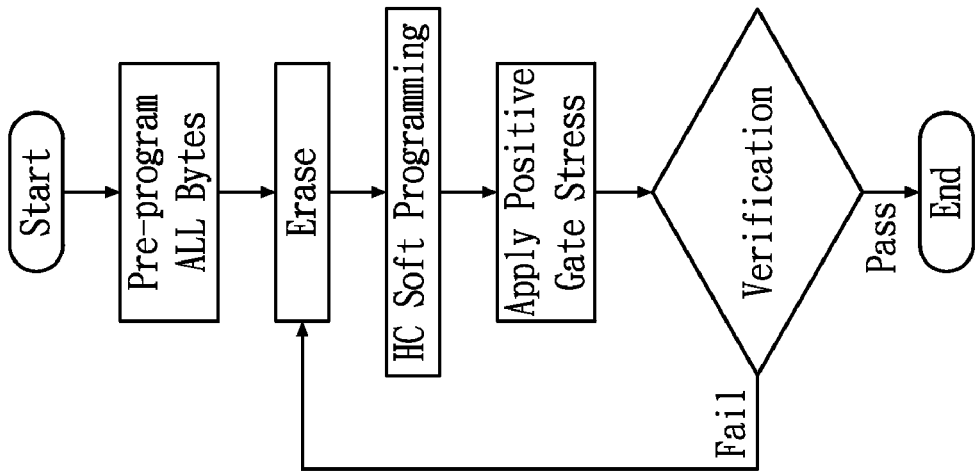
FIGS. 3A to 3C show other prior flow charts.
Figure 3B:
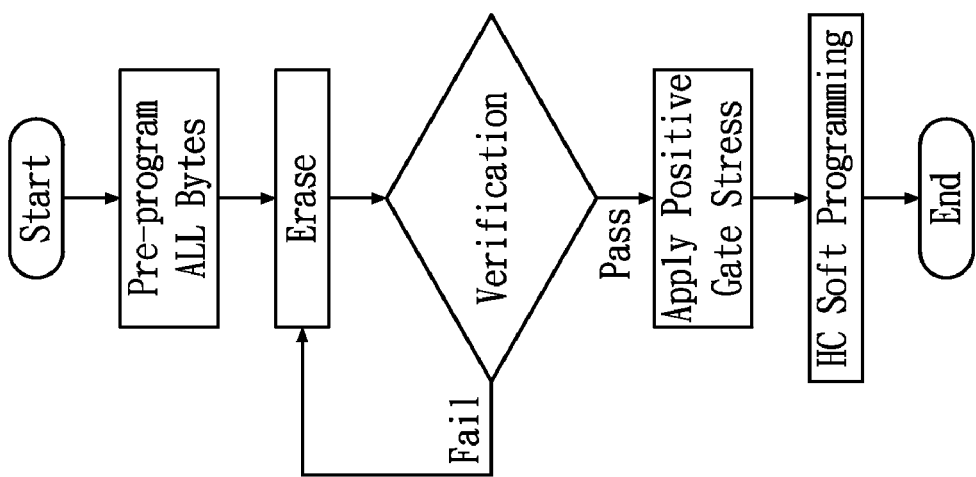
Figure 3A:
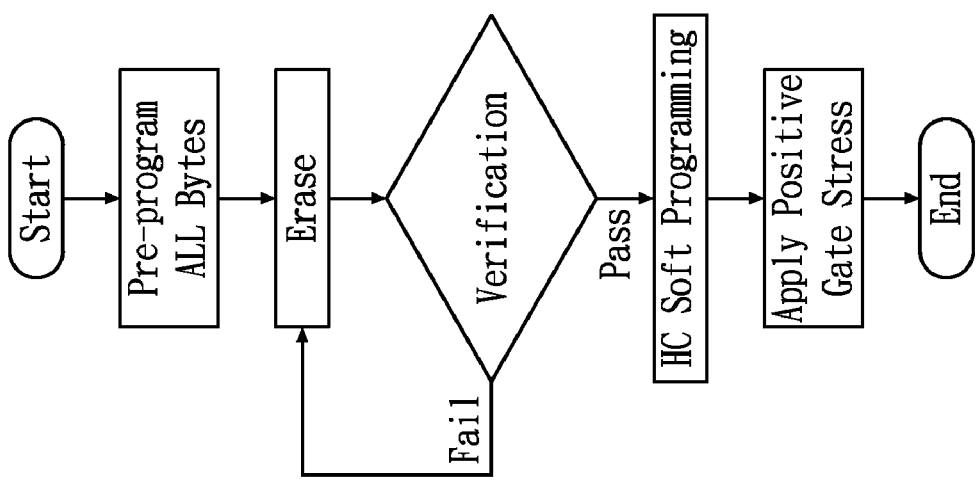
Figure 4:
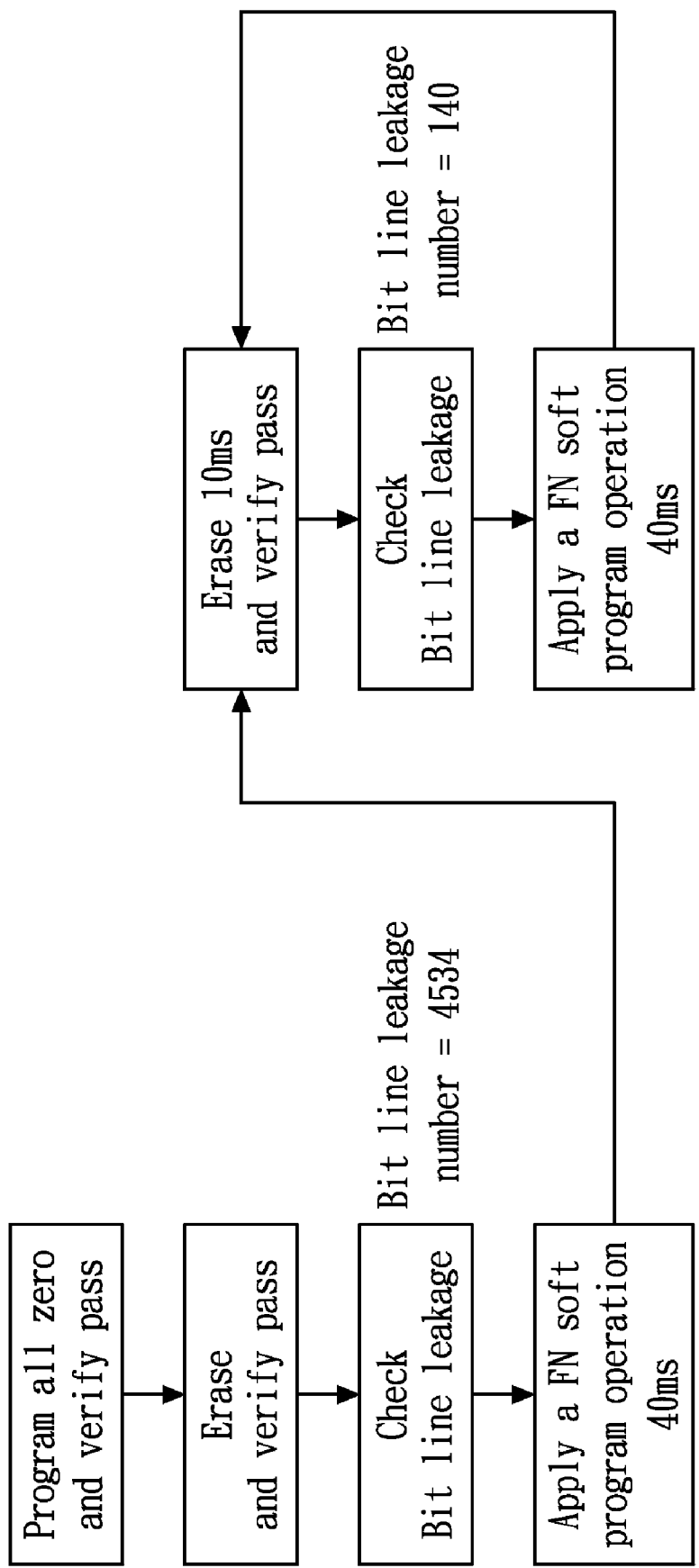
FIG. 4 shows another prior flow chart.

The present invention proposes an over-erase correction method to recover the over-erased cells by using an FN soft program operation at first, then checking the bit line leakage. If some bit line leakages occur, then using an HC soft program to conduct a further over-erase correction so that the threshold distribution of the erased cells is narrowed down. As shown by the experiment data in FIG. 4, after the first FN program operation, it is easy to process the remaining bit line leakages with an HC soft program instead of another FN soft program, especially at low operating voltage and high temperature conditions. With the HC soft program in the second half, the present invention combines the benefits of positive gate stress method and hot-carrier post-program method to narrow the threshold distribution of the erased cells and can avoid repeated iterations between erase and verification operations and soft program, thus saving a lot of time in the process.

Figure 6:
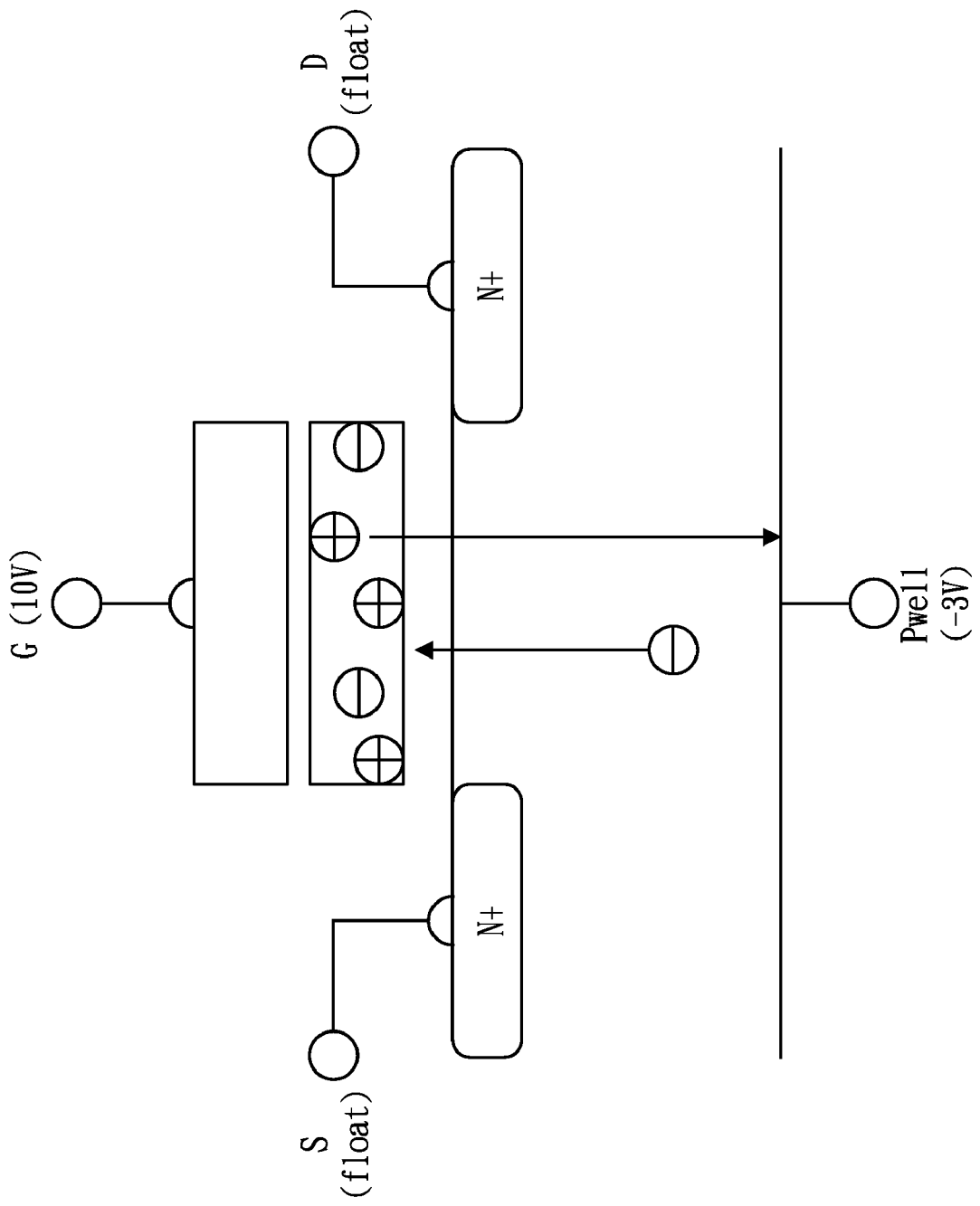
FIG. 6 shows a Fowler-Nordheim soft program in accordance with one embodiment of the present invention.

FIG. 6 shows a Fowler-Nordheim soft program in accordance with one embodiment of the present invention. As shown in FIG. 6, a high voltage of 10 volts is applied to the gate terminal, and a negative voltage of −3 volts is applied to the P well, so that electronics are reinforced with energies to fill the position from which a hole left. As such, the threshold voltage will increase.

Figure 7:
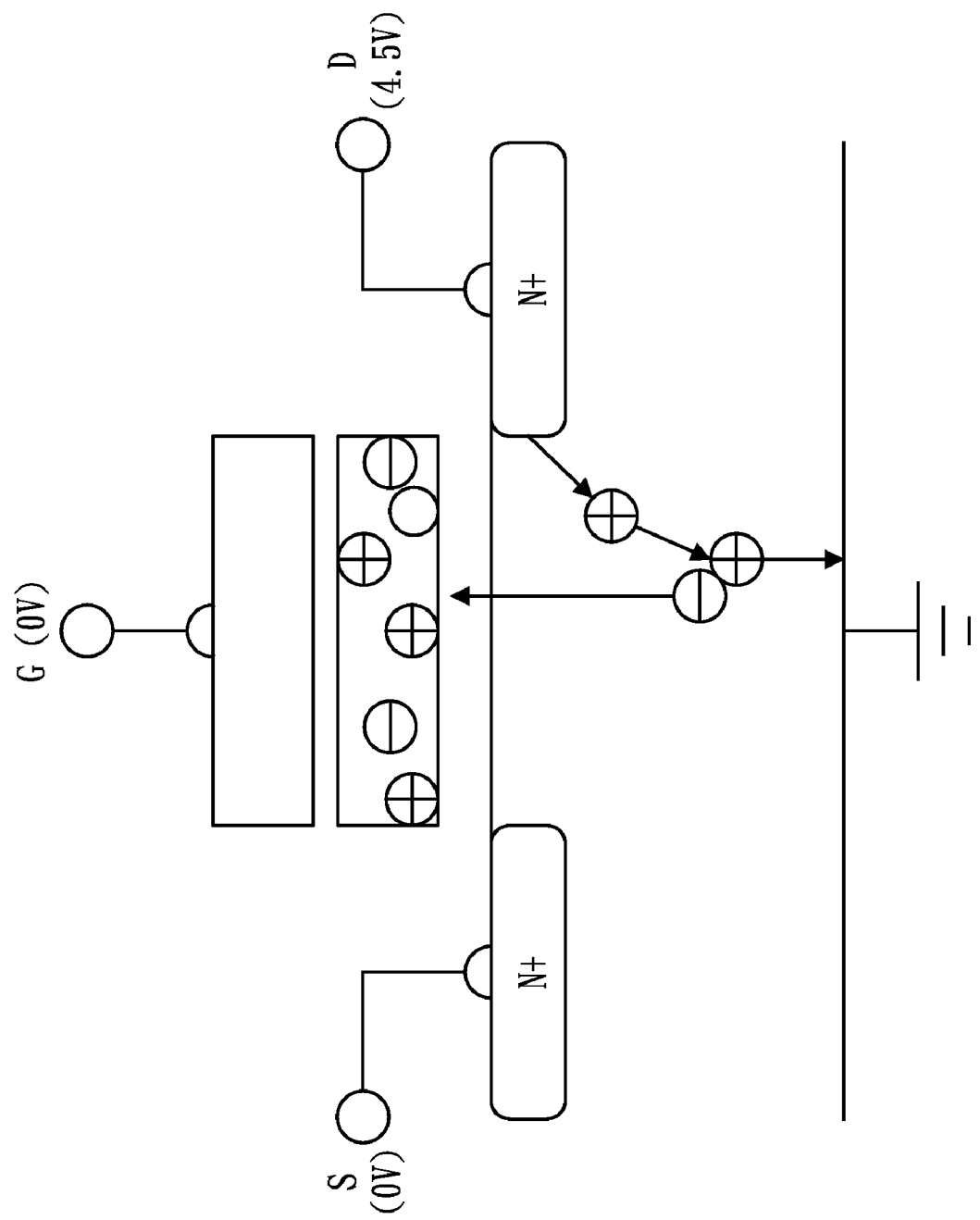
FIG. 7 shows a drain avalanche hot carrier (DAHC) soft program in accordance with one embodiment of the present invention.

FIG. 7 shows a DAHC soft program in accordance with one embodiment of the present invention. As shown in FIG. 7, a middle voltage of 4.5 volts is applied to the drain terminal, so that hole will run from the drain terminal to the substrate. As such, the threshold voltage will increase.

Figure 8:
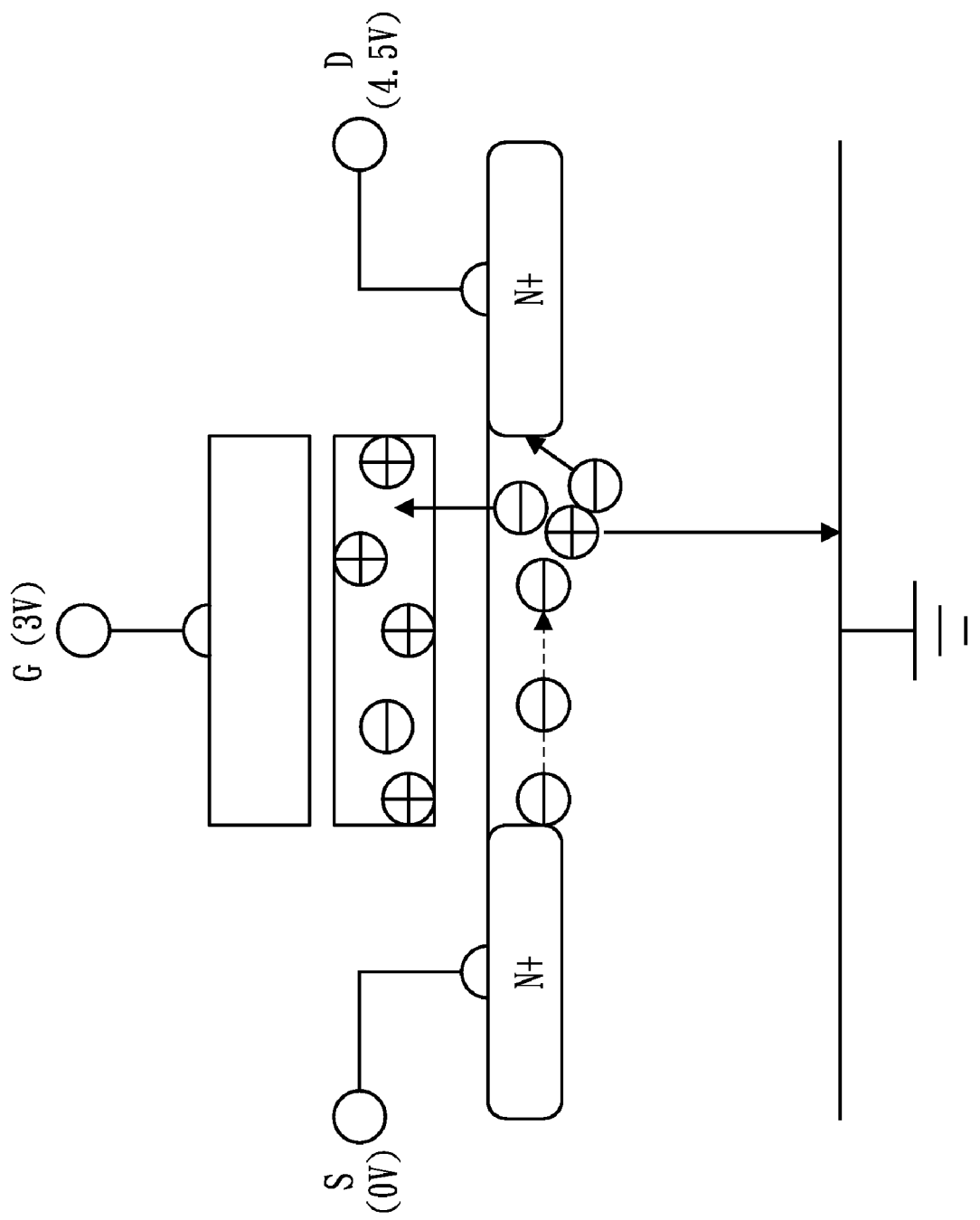
FIG. 8 shows a hot-carrier soft program in accordance with one embodiment of the present invention.

FIG. 8 shows a hot-carrier soft program in accordance with one embodiment of the present invention. As shown in FIG. 8, a middle voltage of 4.5 volts is applied to the drain terminal and a middle voltage of 3.0 volts is applied to the gate terminal, so that the channel is formed and the capability that the electronics run upward is significant. As such, the threshold voltage will increase more.

The above-described embodiments of the present invention are intended to be illustrative only. Numerous alternative embodiments may be devised by those skilled in the art without departing from the scope of the following claims.

What is claimed is:

1. A method for conducting an over-erase correction, comprising the steps of:
   (a) conducting a first erase and verification operation;
   (b) conducting a first bit line check;
   (c) using a Fowler-Nordheim (FN) soft program to correct over-erased cells if bit line leakage is found after the first erase and verification operation;
   (d) conducting a second bit line check;
   (e) conducting a second erase and verification operation; and
   (f) using a hot carrier (HC) soft program to correct over-erased cells if bit line leakage is found after the second erase and verification operation.

2. The method of claim 1, wherein the FN soft program is conducted by a reversed erase or positive gate stress operation.

3. The method of claim 1, wherein the HC soft program is conducted by a drain avalanche hot carrier injection or a channel hot carrier injection.

4. The method of claim 1, wherein the FN soft program is conducted by applying about 10 volts at gate terminals and about −3 volts at P well.

5. The method of claim 1, wherein the HC soft program is a drain avalanche hot carrier (DAHC) soft program, which is conducted by applying about 4.5 volts at drain terminals.

6. The method of claim 1, wherein the HC soft program is conducted by applying about 4.5 volts at drain terminals and about 3 volts at gate terminals.

* * * * *